US011183403B2

United States Patent
Furukawa et al.

(10) Patent No.: US 11,183,403 B2
(45) Date of Patent: Nov. 23, 2021

(54) LIGHT IRRADIATION TYPE HEAT TREATMENT APPARATUS

(71) Applicant: SCREEN Holdings Co., Ltd., Kyoto (JP)

(72) Inventors: Masashi Furukawa, Kyoto (JP); Yoshio Ito, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 184 days.

(21) Appl. No.: 16/055,293

(22) Filed: Aug. 6, 2018

(65) Prior Publication Data

US 2019/0088513 A1 Mar. 21, 2019

(30) Foreign Application Priority Data

Sep. 21, 2017 (JP) .............................. JP2017-181049

(51) Int. Cl.
*H01L 21/67* (2006.01)
*H01L 21/687* (2006.01)

(52) U.S. Cl.
CPC .. *H01L 21/67115* (2013.01); *H01L 21/67248* (2013.01); *H01L 21/68707* (2013.01); *H01L 21/68742* (2013.01)

(58) Field of Classification Search
CPC ................................................ H01L 21/67115
See application file for complete search history.

(56) References Cited

U.S. PATENT DOCUMENTS

| | | | |
|---|---|---|---|
| 4,649,261 A | 3/1987 | Sheets | 219/390 |
| 2003/0183612 A1 | 10/2003 | Timans et al. | 219/390 |

(Continued)

FOREIGN PATENT DOCUMENTS

| | | |
|---|---|---|
| JP | 60-258928 A | 12/1985 |
| JP | 2005-527972 | 9/2005 |

(Continued)

OTHER PUBLICATIONS

Notice of Reasons for Refusal dated Jun. 22, 2021 in counterpart Japanese Patent Application No. 2017-181049 with English translation obtained from One Portal Dossier.

(Continued)

*Primary Examiner* — John J Norton
(74) *Attorney, Agent, or Firm* — Ostrolenk Faber LLP

(57) ABSTRACT

A semiconductor wafer held by a susceptor in a chamber is irradiated with halogen light radiated from a plurality of halogen lamps to be heated. A stainless steel block having an opening in a cylindrical shape is provided between the chamber and the halogen lamps. This reduces a distance from a light emitting portion in a light source region in which the plurality of halogen lamps is arranged, throughout the entire circumference of the opening in a cylindrical shape, so that the amount of reflected light from the inner wall surface of the opening toward the peripheral portion of the semiconductor wafer becomes uniform. This causes a uniform increase in illuminance of the peripheral portion of the semiconductor wafer, where temperature tends to decrease, at the time of light irradiation from the halogen lamps, so that in-plane temperature distribution of the semiconductor wafer can be made uniform.

3 Claims, 10 Drawing Sheets

(56) References Cited

U.S. PATENT DOCUMENTS

| | | | |
|---|---|---|---|
| 2006/0197454 A1 | 9/2006 | Mizukawa et al. | |
| 2008/0203924 A1* | 8/2008 | Kitagawa | H01K 1/16 315/46 |
| 2008/0298787 A1* | 12/2008 | Suzuki | H01K 7/00 392/411 |
| 2009/0103905 A1* | 4/2009 | Tanino | H01L 21/67115 392/411 |
| 2009/0175605 A1* | 7/2009 | Kobayashi | H01L 21/67115 392/416 |
| 2009/0245761 A1* | 10/2009 | Nakajima | H01L 21/67115 392/416 |
| 2014/0287170 A1* | 9/2014 | Ranish | H01L 21/67115 428/34.1 |
| 2016/0234881 A1* | 8/2016 | Rao | H05B 3/0047 |
| 2016/0262207 A1* | 9/2016 | Abe | H01L 21/67115 |

FOREIGN PATENT DOCUMENTS

| | | | |
|---|---|---|---|
| JP | 2006-279008 | A | 10/2006 |
| JP | 2009-231661 | A | 10/2009 |
| JP | 2009-272399 | A | 11/2009 |
| JP | 2009-302131 | A | 12/2009 |
| JP | 2012-174879 | A | 9/2012 |
| JP | 2016-171273 | A | 9/2016 |

OTHER PUBLICATIONS

Notice of Reasons for Refusal dated Aug. 10, 2021 in counterpart Japanese Patent Application No. 2017-181049 with English translation obtained from One Portal Dossier.

* cited by examiner

F I G . 4
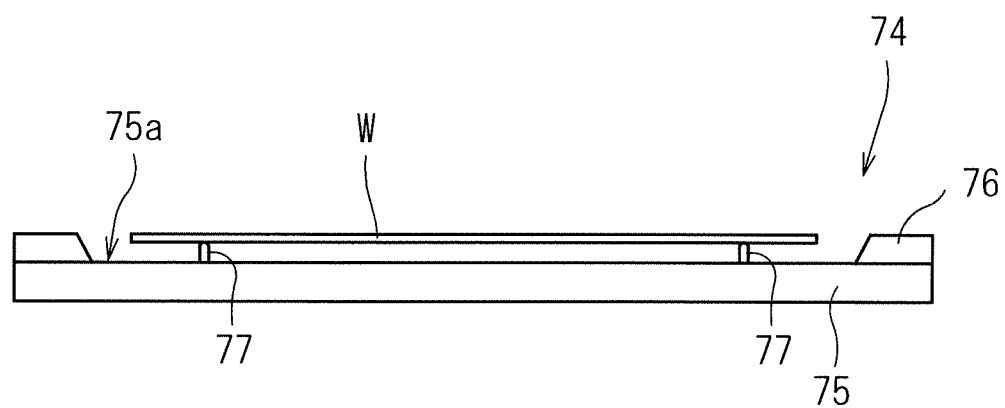

F I G . 6
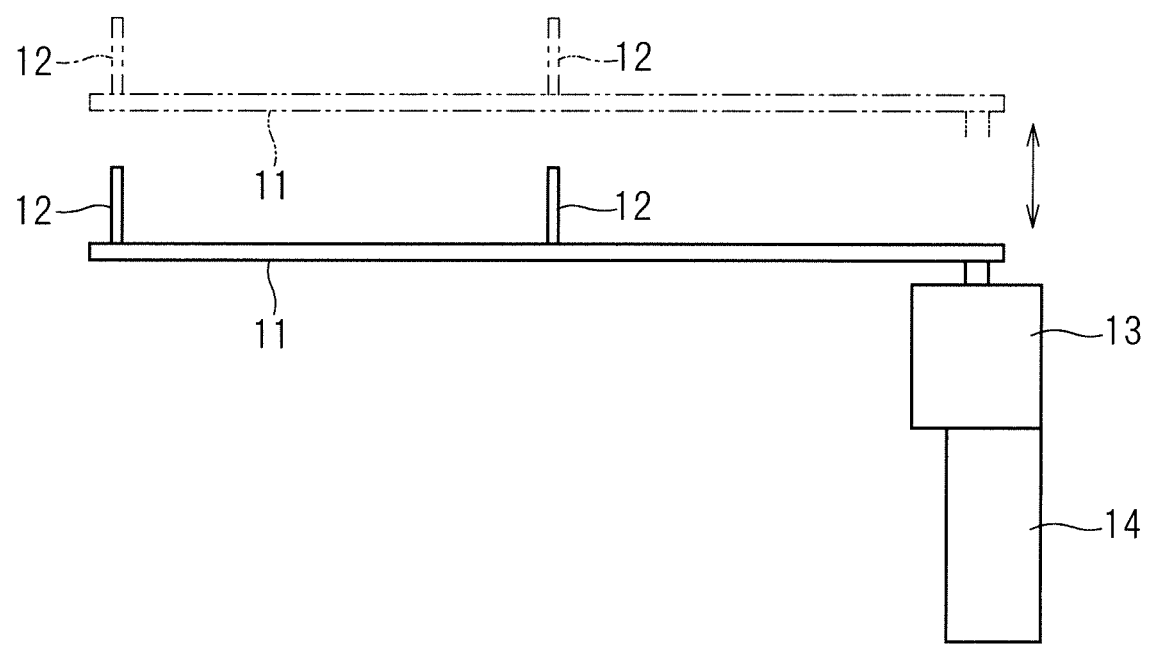

F I G. 9
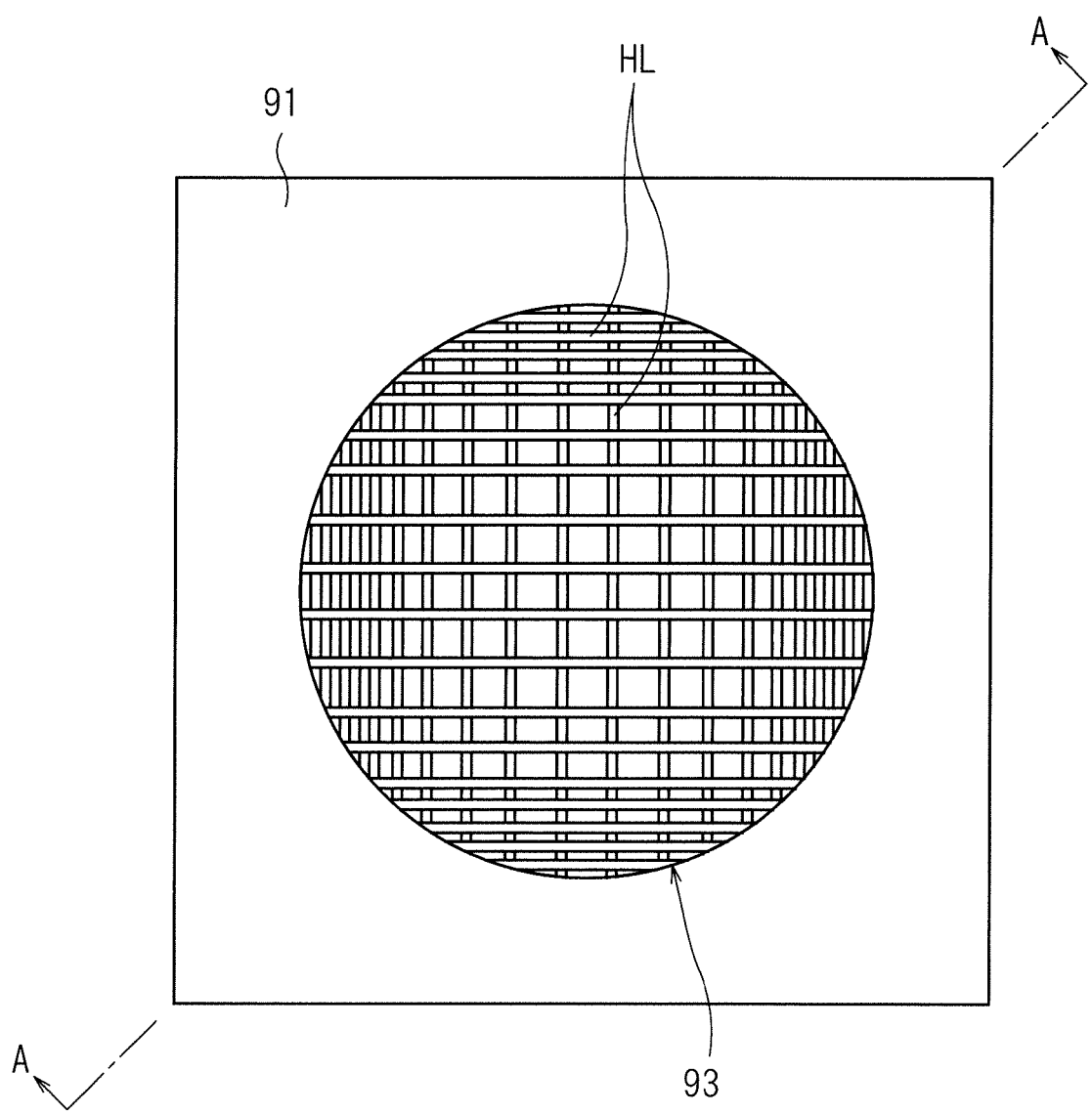

LIGHT IRRADIATION TYPE HEAT TREATMENT APPARATUS

BACKGROUND OF THE INVENTION

Field of the Invention

The present invention relates to a heat treatment apparatus for irradiating a thin-plated precision electronic substrate in the shape of a disk (hereinafter referred to as simply "substrate") such as a semiconductor wafer with light to heat the substrate.

Description of the Background Art

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ions of impurity elements such as boron (B), arsenic (As) and phosphorus (P) to collide against the semiconductor wafer with high acceleration voltage, thereby physically implanting the impurities into the semiconductor wafer. The implanted impurities are activated by the subsequent annealing process. When annealing time in this annealing process is approximately several seconds or longer, the implanted impurities are deeply diffused by heat. This results in a junction depth much greater than a required depth, which might constitute a hindrance to good device formation.

In recent years, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer implanted with impurities in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer. Therefore, the temperature rise in an extremely short time with the xenon flash lamps allows only the activation of impurities to be achieved without deep diffusion of the impurities.

As a heat treatment apparatus using a xenon flash lamp as described above, U.S. Pat. No. 4,649,261 and US2003/0183612 each disclose a heat treatment apparatus in which a pulsed emission lamp such as a flash lamp is disposed on a front surface side of a semiconductor wafer arrangement, and a continuous lighting lamp such as a halogen lamp is disposed on a back surface side thereof, to perform desired heat treatment by combination of the lamps, for example. In the heat treatment apparatus disclosed in each of U.S. Pat. No. 4,649,261 and US2003/0183612, the halogen lamp applies assist heating to a semiconductor wafer to some extent temperature, and then a front surface of the semiconductor wafer is increased in temperature to a desired treatment temperature by pulse heating from the flash lamp.

When assist heating is performed with a halogen lamp as disclosed in each of U.S. Pat. No. 4,649,261 and US2003/0183612, there is a merit in process, enabling a semiconductor wafer to be heated to a comparatively high assist heating temperature in a short time. However, this tends to cause a problem that a peripheral portion of the wafer has a temperature lower than that of a central portion thereof. It is conceivable that such nonuniformity of temperature distribution may be caused by heat radiation from the peripheral portion of the semiconductor wafer or thermal conduction from the peripheral portion of the semiconductor wafer to a quartz susceptor of a relatively low temperature. To solve such a problem, Japanese Patent Application Laid-open No. 2012-174879 discloses a cylindrical louver made of a translucent material that is disposed between a halogen lamp and a semiconductor wafer to make in-plane temperature distribution uniform during assist heating. When such a louver is provided, temperature inside the peripheral portion of the semiconductor wafer can be lowered. As a result, temperature of the peripheral portion can be relatively increased to make in-plane temperature distribution as uniform as possible.

Unfortunately, even if a louver as disclosed in Japanese Patent Application Laid-open No. 2012-174879 is provided, it is difficult to sufficiently suppress a relative temperature drop of the peripheral portion of the semiconductor wafer. Thus, further improvement in uniformity of in-plane temperature distribution has been desired.

SUMMARY OF THE INVENTION

The present invention is directed to a heat treatment apparatus for irradiating a disk-shaped substrate with light to heat the substrate.

According to one aspect of the present invention, a heat treatment apparatus includes the following: a chamber for receiving a substrate therein; a holder for holding the substrate in the chamber; a light irradiator having a plurality of rod-like lamps arranged in a rectangular light source region including a region facing a main surface of the substrate held by the holder to irradiate the substrate with light through a quartz window provided in the chamber; and a cylindrical body having an opening in a cylindrical shape, being provided between the chamber and the light irradiator.

This causes the amount of reflected light directed to a peripheral portion of the disk-shaped substrate from an inner wall surface of the opening to be uniform to enable in-plane temperature distribution of the substrate to be uniform.

According to another aspect of the present invention, a heat treatment apparatus includes the following: a chamber for receiving the substrate therein, having an inner wall surface in a cylindrical shape; a holder for holding the substrate in the chamber; a light irradiator having a plurality of rod-like lamps arranged in a rectangular light source region including a region facing a main surface of the substrate held by the holder to irradiate the substrate with light through a quartz window provided in the chamber; and a cylindrical body having an opening in an elliptical cylindrical shape, being provided between the chamber and the light irradiator, wherein a difference between a major diameter of the opening of the cylindrical body and a diameter of the inner wall surface of the chamber, as well as a difference between a minor diameter of the opening of the cylindrical body and a diameter of the inner wall surface of the chamber is 20 mm or less.

This causes the amount of reflected light directed to a peripheral portion of the disk-shaped substrate from an inner wall surface of the opening to be uniform to enable in-plane temperature distribution of the substrate to be uniform.

It is preferable that the inner wall surface of the opening of the cylindrical body have a reflectance equal to or higher than a reflectance of the inner wall surface of the chamber.

This causes increase in illuminance of the peripheral portion of the substrate to enable in-plane temperature distribution of the substrate to be more uniform.

It is preferable that there be no filament of the plurality of rod-like lamps at four corners of the rectangular light source region.

This reduces a distance from a light emitting portion in the light source region to the opening throughout its circumference to enable the amount of reflected light from the inner wall surface of the opening toward the peripheral portion of the substrate to be more uniform.

Thus, it is an object of the present invention to cause in-plane temperature distribution of the substrate to be uniform.

These and other objects, features, aspects and advantages of the present invention will become more apparent from the following detailed description of the present invention when taken in conjunction with the accompanying drawings.

BRIEF DESCRIPTION OF THE DRAWING

FIG. 4 is a sectional view of the susceptor;

FIG. 6 is a side view of the transfer mechanism;

FIG. 9 illustrates a light source region in which a plurality of halogen lamps is arranged as viewed from an opening of the stainless steel block.

DESCRIPTION OF THE PREFERRED EMBODIMENTS

Preferred embodiments according to the present invention will now be described in detail with reference to the drawings.

Figure 1:
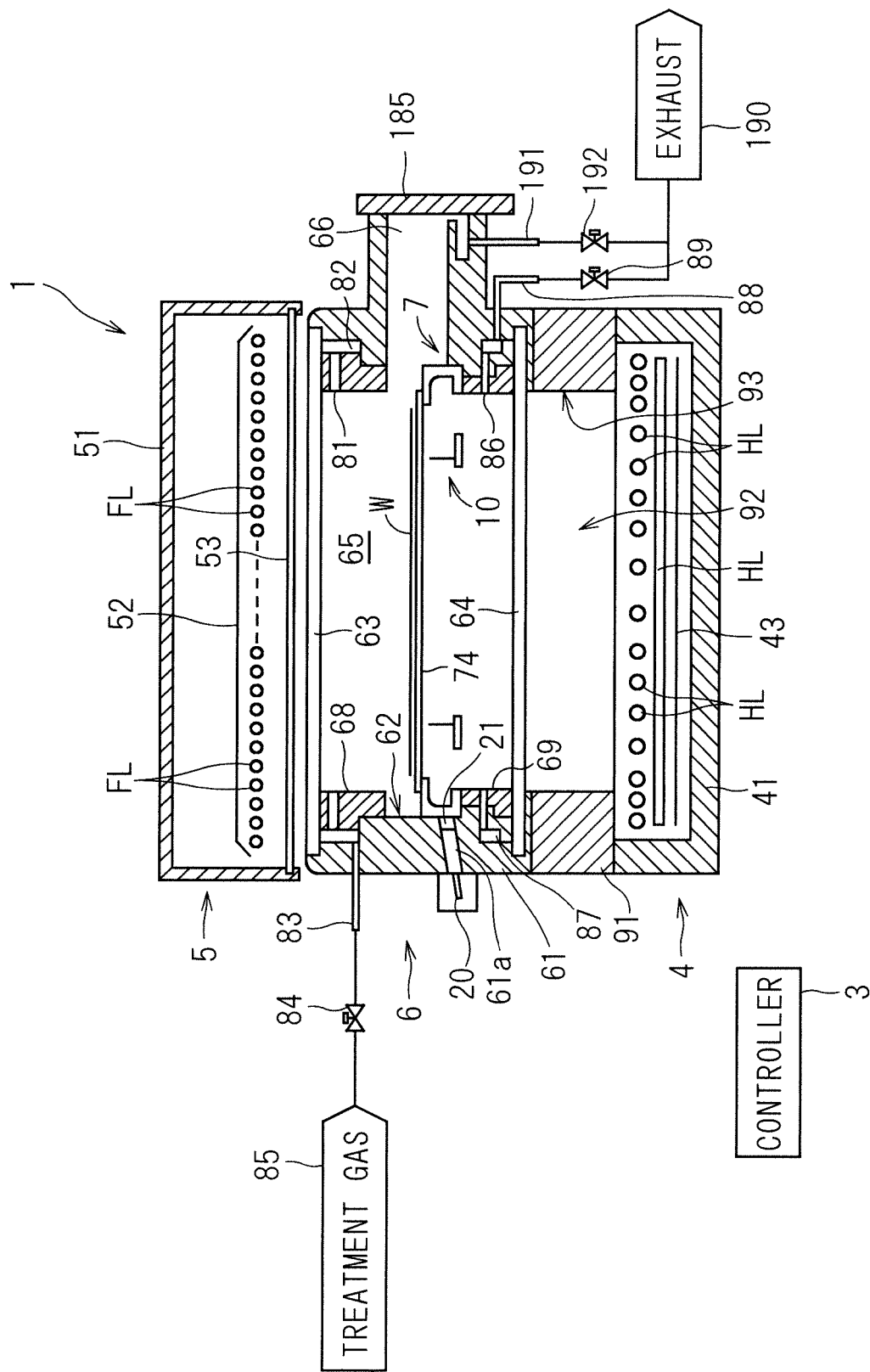
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm (in the present preferred embodiment, 300 mm). The semiconductor wafer W prior to the transport into the heat treatment apparatus 1 is implanted with impurities. The heat treatment apparatus 1 performs a heating treatment on the semiconductor wafer W to thereby activate the impurities implanted in the semiconductor wafer W. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. A stainless steel block 91 is provided between the halogen heating part 4 and the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a substantially cylindrical shape with an open top and an open bottom. The upper chamber window 63 is mounted to block the open top of the chamber side portion 61, and the lower chamber window 64 is mounted to block the open bottom thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

The chamber side portion 61 is further provided with a through hole 61a bored therein. A radiation thermometer 20 is mounted to a location of an outer wall surface of the chamber side portion 61 where the through hole 61a is provided. The through hole 61a is a cylindrical hole for directing infrared radiation emitted from the lower surface of a semiconductor wafer W held by a susceptor 74 to be described later therethrough to the radiation thermometer 20. The through hole 61a is inclined with respect to a horizontal direction so that a longitudinal axis (an axis extending in a direction in which the through hole 61a extends through the chamber side portion 61) of the through hole 61a intersects a main surface of the semiconductor wafer W held by the susceptor 74. A transparent window 21 made of barium fluoride material transparent to infrared radiation in a wavelength range measurable with the radiation thermometer 20 is mounted to an end portion of the through hole 61a which faces the heat treatment space 65. The radiation thermometer 20 receives infrared light emitted from the lower surface of the semiconductor wafer W through the transparent window 21 and measures temperature of the semiconductor wafer W based on intensity of the infrared light.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), reactive gases such as hydrogen ($H_2$) and ammonia ($NH_3$), and mixtures of these gases (although nitrogen gas is used in this preferred embodiment).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The treatment gas supply source 85 and the exhaust part 190 may be mechanisms provided in the heat treatment apparatus 1 or be utility systems in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 2:
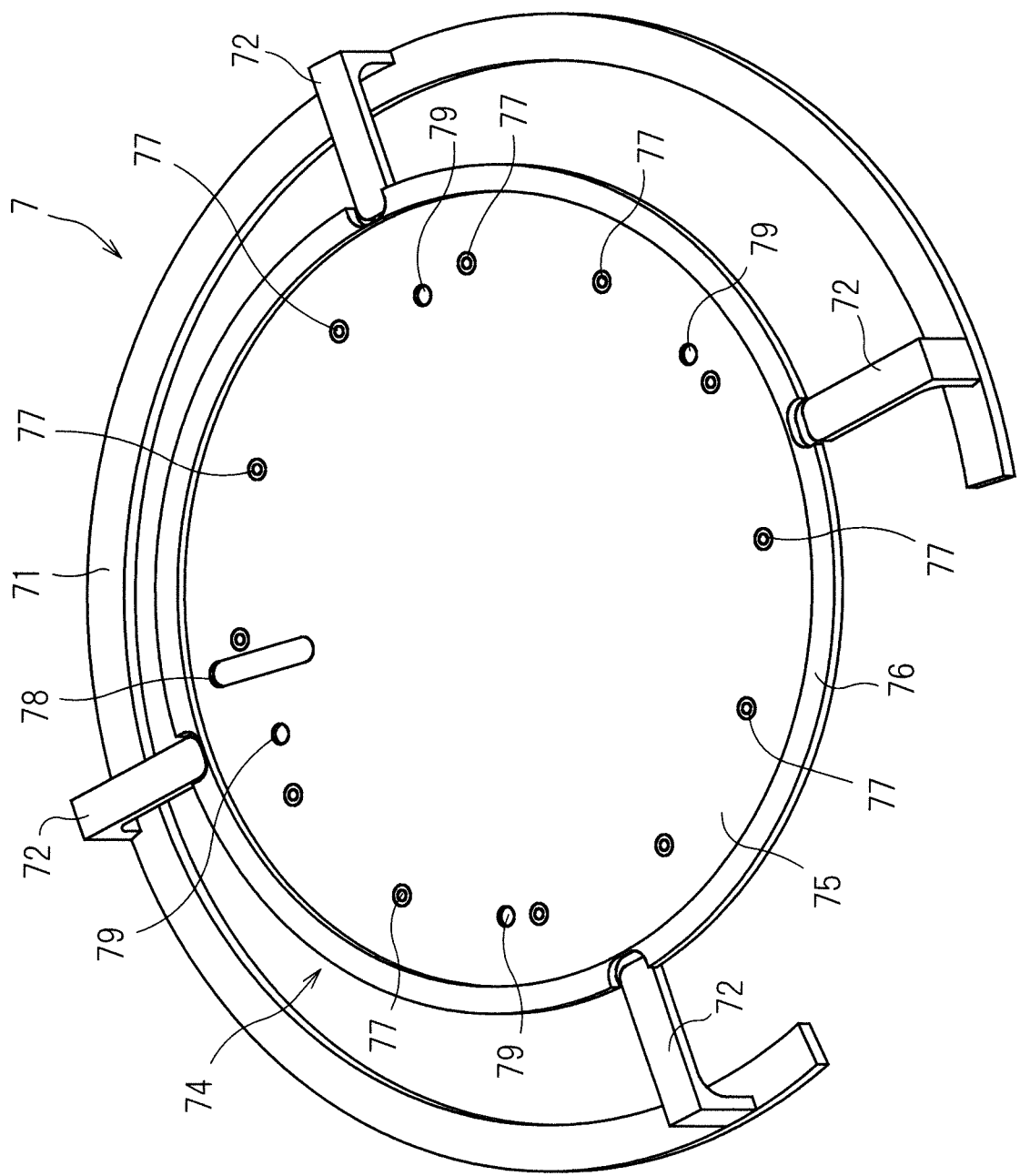
FIG. 2 is a perspective view showing an entire external appearance of a holder.

FIG. 2 is a perspective view showing an entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by a wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 3:
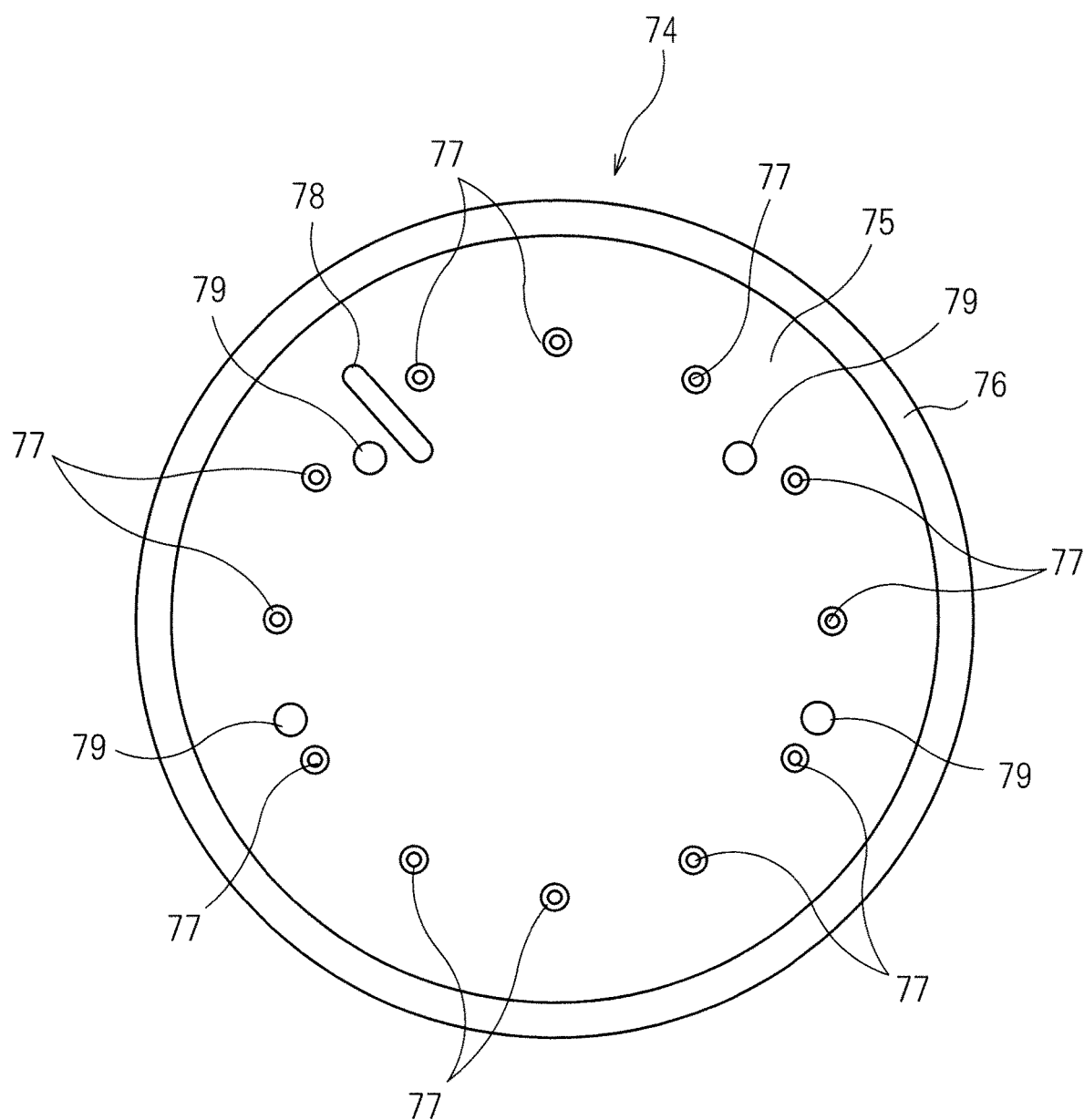
FIG. 3 is a plan view of a susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 provided upright are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is slightly smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the susceptor 74 coincides with a vertical direction). In other words, the holding surface 75a of the holding plate 75 becomes a horizontal surface.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is formed in the holding plate 75 of the susceptor 74 so as to extend vertically through the holding plate 75 of the susceptor 74. The opening 78 is provided for the radiation thermometer 20 to receive radiation (infrared radiation) emitted from the lower surface of the semiconductor wafer W. Specifically, the radiation thermometer 20 receives the radiation emitted from the lower surface of the semiconductor wafer W through the opening 78 and the transparent window 21 mounted to the through hole 61a in the chamber side portion 61 to measure the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
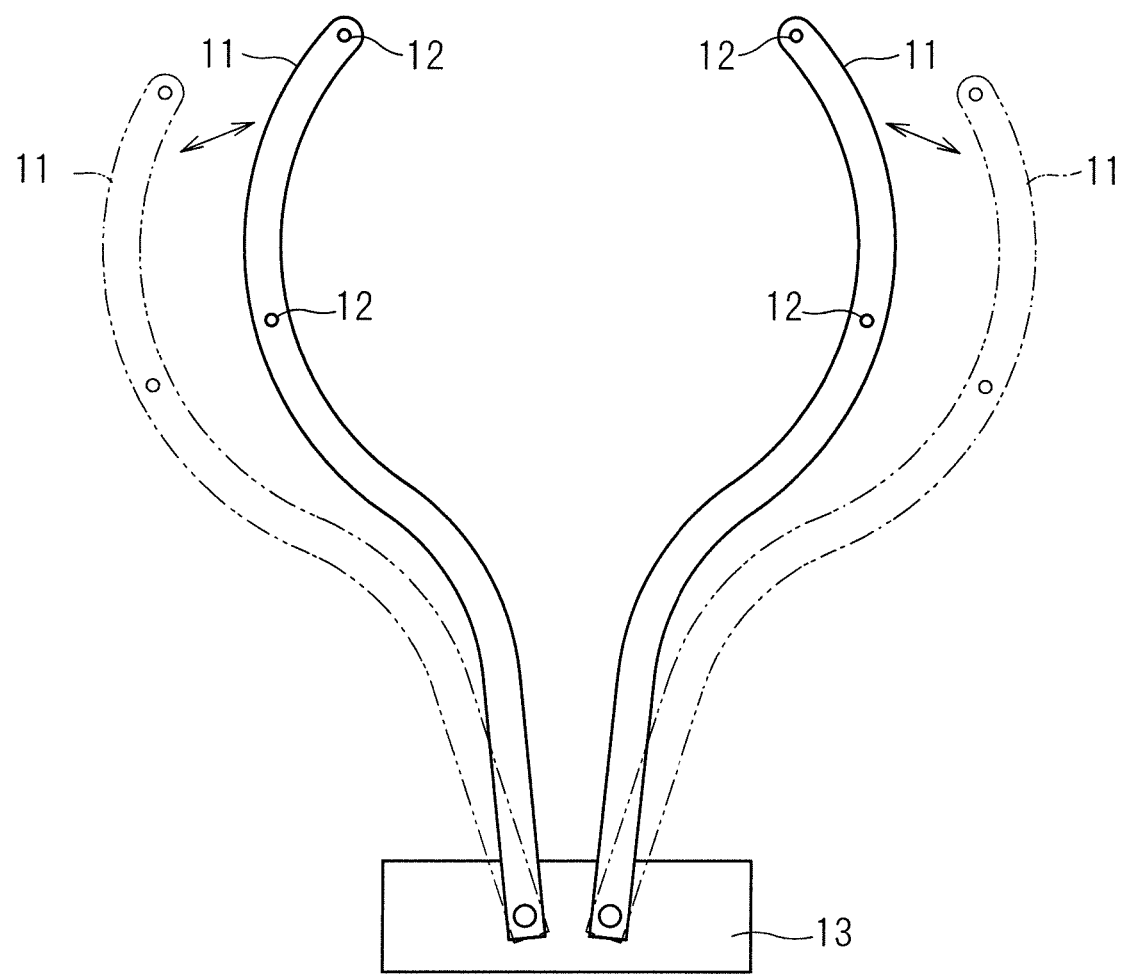
FIG. 5 is a plan view of a transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane. A region in which the flash lamps FL are arranged has a size, as seen in plan view, greater than that of the semiconductor wafer W.

Each of the xenon flash lamps FL includes a cylindrical glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 is a light irradiator that directs light from under the chamber 6 through the lower chamber window 64 toward the heat treatment space 65 to heat the semiconductor wafer W by means of the halogen lamps HL.

Figure 7:
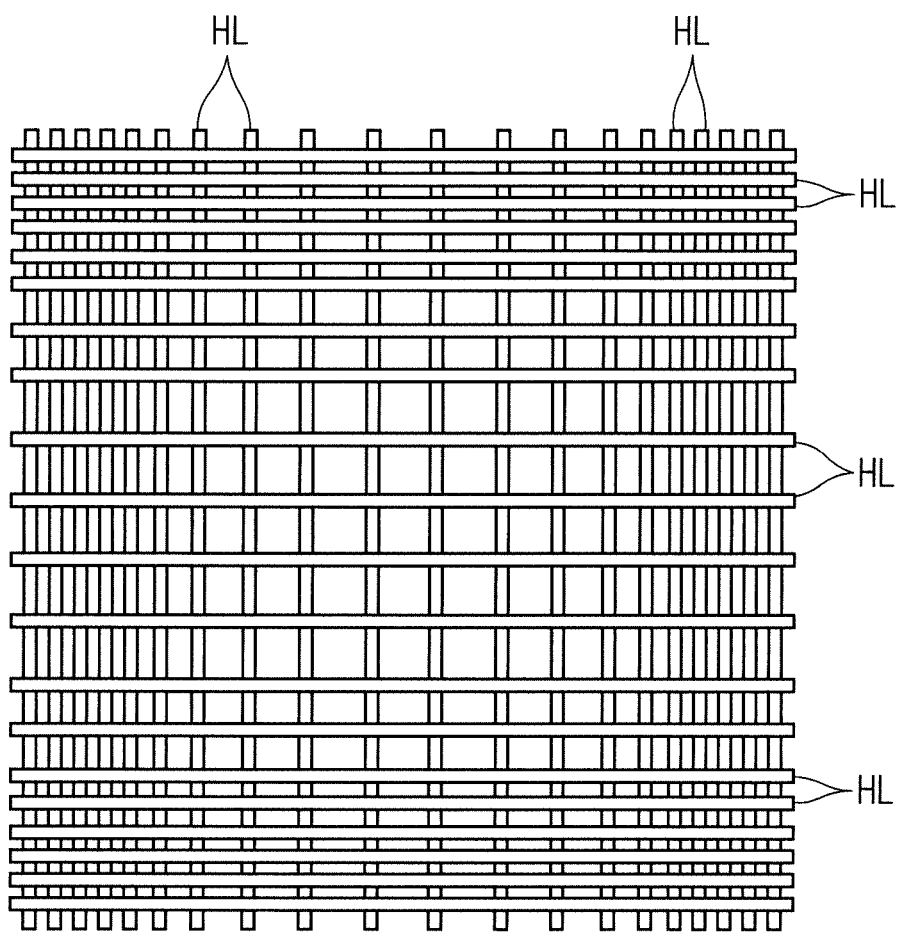
FIG. 7 is a plan view showing an arrangement of halogen lamps.

FIG. 7 is a plan view showing an arrangement of the multiple halogen lamps HL. The multiple halogen lamps HL are arranged in a rectangular light source region wider than the main surface (i.e., a circle with a diameter of 300 mm) of the disk-shaped semiconductor wafer W held by the holder 7. The light source region in which the multiple halogen lamps HL are arranged includes a region facing the lower surface of the main surfaces of the semiconductor wafer W.

As illustrated in FIGS. 1 and 7, 40 halogen lamps HL are arranged in two tiers, upper and lower. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As illustrated in FIG. 7, the group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for at least not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

As shown in FIG. 7, the halogen lamps HL in each of the upper and lower tiers are disposed at a higher density in a region opposed to a peripheral portion of the semiconductor wafer W held by the holder 7 than in a region opposed to a central portion thereof. In other words, the halogen lamps HL in each of the upper and lower tiers are arranged at shorter intervals in the peripheral portion of the light source region than in the central portion thereof. This causes the illuminance from the peripheral portion to be stronger than that from the central portion of the light source area to enable the peripheral portion of the semiconductor wafer W where temperature tends to decrease to be irradiated with a greater amount of light when the semiconductor wafer W is heated by light irradiation from the halogen heating part 4.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

Figure 8:
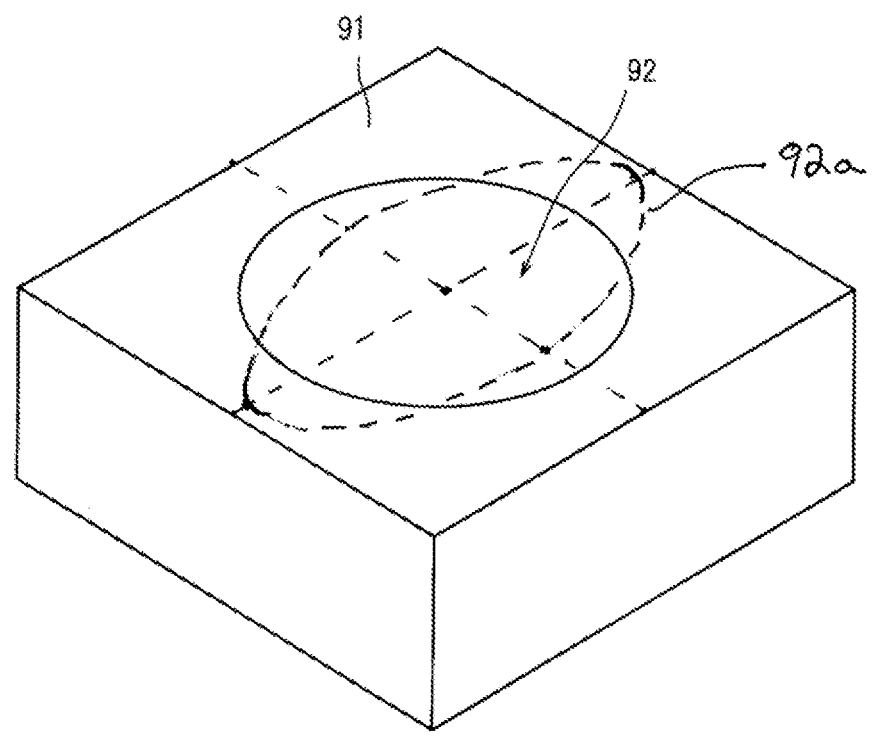
FIG. 8 is a perspective view of a stainless steel block.

The stainless steel block 91 is provided so as to be interposed between the chamber 6 and the halogen heating part 4. FIG. 8 is a perspective view of the stainless steel block 91. The stainless steel block 91 has an outer shape that is a quadrangular prism shape similar to that of the halogen heating part 4. The stainless steel block 91 in a quadrangular prism shape is provided with an opening 92 in a cylindrical shape such that it vertically passes through the stainless steel block 91. The opening 92 has upper and lower ends that are open. That is, the stainless steel block 91 is a hollow cylindrical body having the opening 92 in a bottomless cylindrical shape. The stainless steel block 91 is made of stainless steel (e.g., SUS 316 or SUS 304, etc. of Japanese Industrial Standard).

The stainless steel block 91 is connected to a lower end of the chamber 6 by fastening parts such as screws. When the stainless steel block 91 is connected to the chamber 6, the central axis of the opening 92 aligns with the central axis of an internal space of the chamber 6 having a substantially cylindrical shape. The center axis of the opening 92 also aligns with the central axis of the semiconductor wafer W held by the holder 7. In addition, the central axis of the opening 92 also aligns with the central axis of the light source region in which the plurality of halogen lamps HL is arranged.

In the present preferred embodiment, the inner wall surface in a substantially cylindrical shape (the chamber side portion 61 and the inner wall surface of each of the reflection rings 68 and 69) of the chamber 6 has a diameter of 436 mm. In contrast, the opening 92 of the stainless steel block 91 is configured to have a diameter of 416 mm or more and 456 mm or less. That is, a difference between the diameter of the opening 92 of the stainless steel block 91 and the diameter of the inner wall surface of the chamber 6 is within a range of ±20 mm, and the lower end of the chamber 6 and an upper end of the stainless steel block 91 are provided with respective openings each having a substantially identical shape such that the openings face each other.

FIG. 9 illustrates the light source region in which the plurality of halogen lamps HL is arranged as viewed from the opening 92 of the stainless steel block 91. A range of a visual field viewed downward through the opening 92 in a cylindrical shape is narrower than the light source region in which the plurality of halogen lamps HL is arranged. As illustrated in FIG. 9, while the central portion of the light source region is within the range of the visual field through the opening 92, the four corners of the light source region are out of the range of the visual field through the opening 92. That is, the four corners of the light source region in which the plurality of halogen lamps HL is arranged become respective shadow areas of the stainless steel block 91.

In the present preferred embodiment, the inner wall surface of the chamber 6 is mirror-finished by nickel plating. Then, nickel plating is also applied to the inner wall surface 93 of the opening 92 of the stainless steel block 91. That is, the inner wall surface 93 of the stainless steel block 91 has the same surface finish as the inner wall surface of the chamber 6, so that the inner wall surface 93 of the stainless steel block 91 has a reflectance equal to that of the inner wall surface of the chamber 6.

Referring again to FIG. 1, the controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. The stainless steel block 91 is provided with a heat exhaust port for cooling the halogen heating part 4. In addition, air is supplied to a gap between the upper chamber window 63 and the lamp light radiation window 53 to cool down the flash heating part 5 and the upper chamber window 63.

Next, a procedure for the treatment of a semiconductor wafer W in the heat treatment apparatus 1 will be described. A semiconductor wafer W to be treated herein is a disk-shaped semiconductor substrate, doped with impurities (ions) by an ion implantation process. The impurities are activated by the heat treatment apparatus 1 performing the process of heating (annealing) the semiconductor wafer W by irradiation with a flash of light. The procedure for the treatment in the heat treatment apparatus 1 which will be described below proceeds under the control of the controller 3 over the operating mechanisms of the heat treatment apparatus 1.

First, the valve 84 is opened for supply of gas, and the valves 89 and 192 for exhaust of gas are opened, so that the supply and exhaust of gas into and out of the chamber 6 start. When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transport mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with process steps.

Subsequently, the gate valve 185 is opened to open the transport opening 66. A transport robot outside the heat treatment apparatus 1 transports a semiconductor wafer W subjected to the ion implantation through the transport opening 66 into the heat treatment space 65 of the chamber 6. While at this time, an atmosphere outside the apparatus may be sucked when the semiconductor wafer W is transported, nitrogen gas being continuously supplied into the chamber 6 flows out through the transport opening 66 to enable reduction in suction of an external atmosphere as much as possible.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof patterned and implanted with impurities is the upper surface. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held in a horizontal attitude from below by the susceptor 74 of the holder 7 made of quartz, the 40 halogen lamps HL in the halogen heating part 4 turn on simultaneously to start preheating (or assist-heating). Halogen light emitted from the halogen lamps HL is transmitted through the opening 92 of the stainless steel block 91, and the lower chamber window 64 and the susceptor 74 both made of quartz, and impinges upon the lower surface of the semiconductor wafer W. By receiving halogen light irradiation from the halogen lamps HL, the semiconductor wafer W is subjected to assist heating, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the radiation thermometer 20 when the halogen lamps HL perform the assist heating. Specifically, the radiation thermometer 20 receives infrared radiation emitted from the lower surface of the semiconductor wafer W held by the susceptor 74 through the opening 78 and passing through the transparent window 21 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined assist heating temperature T1 or not. In other words, the controller 3 effects feedback control of the output from the halogen lamps HL so that the temperature of the semiconductor wafer W is equal to the assist heating temperature T1, based on the value measured with the radiation thermometer 20. The assist heating temperature T1 shall be on the order of 200° to 800° C., preferably on the order of 350° to 600° C., (in the present preferred embodiment, 600° C.) at which there is no apprehension that the impurities implanted in the semiconductor wafer W are diffused by heat.

After the temperature of the semiconductor wafer W reaches the assist heating temperature T1, the controller 3 maintains the temperature of the semiconductor wafer W at the assist heating temperature T1 for a short time. Specifically, at the point in time when the temperature of the semiconductor wafer W measured with the radiation thermometer 20 reaches the assist heating temperature T1, the controller 3 adjusts the output from the halogen lamps HL to maintain the temperature of the semiconductor wafer W at approximately the assist heating temperature T1.

Figure 10:
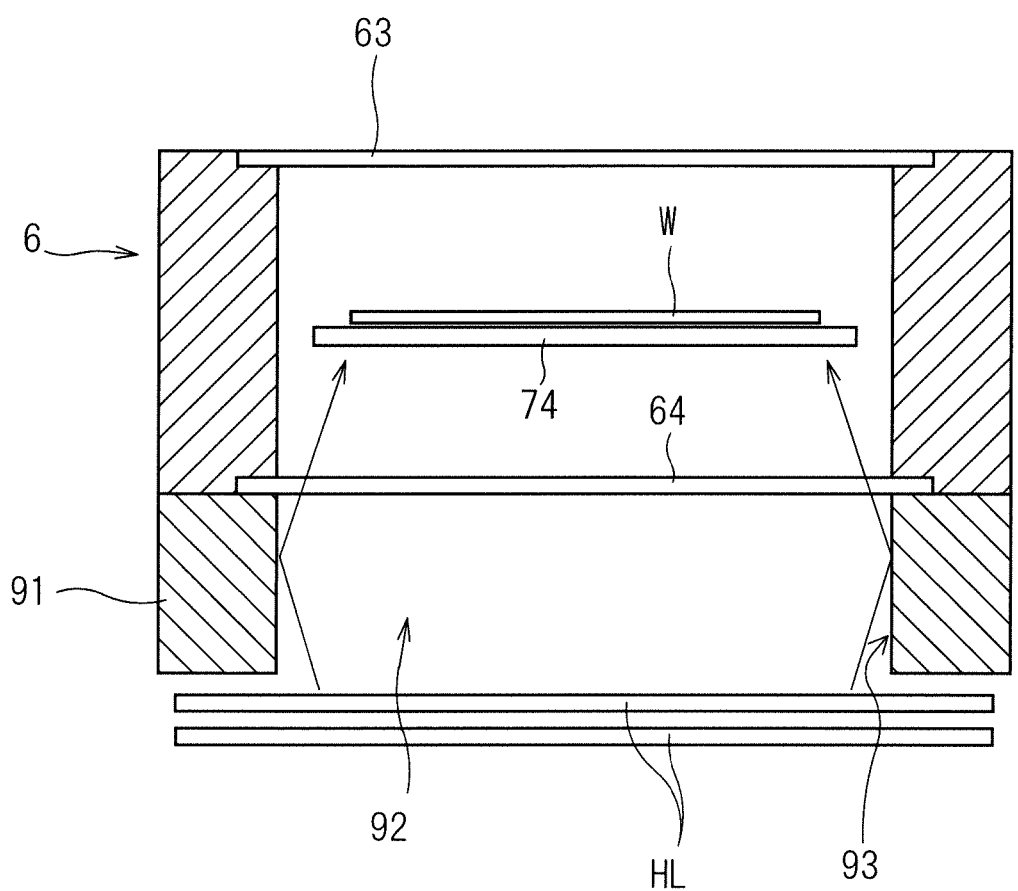
FIG. 10 schematically illustrates an optical path adjustment using the stainless steel block.

In the present preferred embodiment, the stainless steel block 91 having the opening 92 in a cylindrical shape is provided between the halogen heating part 4 and the chamber 6. FIG. 10 schematically illustrates an optical path adjustment using the stainless steel block 91. FIG. 10 is a schematic sectional view of the stainless steel block 91 and the chamber 6 taken along line A-A in FIG. 9. Thus, opposite end portions of the upper and lower halogen lamps HL in two tiers illustrated in FIG. 10 correspond to the four corners of the light source region in which the plurality of halogen lamps HL is arranged.

While the halogen lamp HL of the present preferred embodiment is a light source that causes the filament to be incandescent to emit light, not all of the 40 halogen lamps HL are provided with filaments over the entire length. From the viewpoint of adjusting illuminance distribution on a semiconductor wafer W, the 40 halogen lamps HL include lamps in which filaments are provided only in a part of the entire length. In the arrangement of the 40 halogen lamps HL illustrated in FIG. 7, no filament is present at opposite ends of the halogen lamp HL positioned at each of peripheral portions. Thus, no filament of the halogen lamp HL exists at the four corners of the rectangular light source region in which the plurality of halogen lamps HL is arranged, so that the four corners emit no light. In the schematic view of FIG. 10, opposite end portions of each of the upper and lower halogen lamps HL in two tiers emit no light.

If the opening 92 of the stainless steel block 91 has a quadrangular prism shape corresponding to the rectangular light source region, a distance between each of the four corner portions of the inner wall surface of the stainless steel block 91, and a light emitting portion of the light source region in which the plurality of halogen lamps HL is arranged, is increased to reduce the amount of light reflected by the four corners of the inner wall surface toward the peripheral portion of a semiconductor wafer W. This causes temperature of portions in the peripheral portion of the semiconductor wafer W, corresponding to the four corners of the inner wall surface of the stainless steel block 91, to be relatively low.

In the present preferred embodiment, the opening 92 of the stainless steel block 91 has a cylindrical shape. This causes the four corners of the light source region in which the plurality of halogen lamps HL is arranged to be out of the range of the visual field through the opening 92 (refer to FIG. 9) to shorten a distance from the light emitting portion of the light source region throughout the entire circumference of the opening 92 in a cylindrical shape of the stainless steel block 91. Since the opening 92 has a cylindrical shape, the distance between the inner wall surface 93 of the opening 92 and the peripheral portion of a disk-shaped semiconductor wafer W becomes uniform. As a result, the amount of light emitted from the light emitting portion of the light source region and reflected by the inner wall surface 93 of the cylindrical opening 92 toward the peripheral portion of the disk-shaped semiconductor wafer W becomes uniform. When the reflected light from the inner wall surface 93 of the stainless steel block 91 is uniformly radiated to the peripheral portion of the semiconductor wafer W, illuminance increases relatively uniformly throughout the entire circumference of the peripheral portion of the semiconductor wafer W where temperature tends to decrease during assist heating from the halogen lamps HL to enable in-plane temperature distribution of the semiconductor wafer W to be uniform.

The flash lamps FL in the flash heating part 5 irradiate the front surface of the semiconductor wafer W held by the susceptor 74 with a flash of light at the time when a predetermined time period has elapsed since the temperature of the semiconductor wafer W reached the assist heating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The temperature of the front surface of the semiconductor wafer W subjected to the flash heating by the flash irradiation from the flash lamps FL momentarily increases to a treatment temperature T2 of 1000° C. or higher. After the impurities implanted in the semiconductor wafer W are activated, the temperature of the front surface of the semiconductor wafer W decreases rapidly. Because of the capability of increasing and decreasing the temperature of the front surface of the semiconductor wafer W in an extremely short time, the heat treatment apparatus 1 achieves the activation of the impurities implanted in the semiconductor wafer W while suppressing the diffusion of the impurities due to heat. It should be noted that the time required for the activation of the impurities is extremely short as compared with the time required for the thermal diffusion of the impurities. Thus, the activation is completed in a short time ranging from about 0.1 to about 100 milliseconds during which no diffusion occurs.

In the present preferred embodiment, the stainless steel block 91 having the cylindrical inner wall surface 93 causes in-plane temperature distribution of the semiconductor wafer W in an assist heating stage using the halogen heating part 4 to be uniform to enable also in-plane temperature distribution of the front surface of the semiconductor wafer W during irradiation of a flash of light to be uniform.

After a predetermined time period has elapsed since the completion of the flash heating treatment, the halogen lamps HL turn off. This causes the temperature of the semiconductor wafer W to decrease rapidly from the assist heating temperature T1. The radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W.

In the present preferred embodiment, the opening 92 in a cylindrical shape is provided in the stainless steel block 91 between the chamber 6 and the halogen heating part 4. This causes not only a distance from the light emitting portion of the light source region in which the plurality of halogen lamps HL is arranged to be reduced throughout the entire circumference of the opening 92 in a cylindrical shape of the stainless steel block 91, but also a distance between the inner wall surface 93 of the opening 92 and the peripheral portion of the disk-shaped semiconductor wafer W to be uniform, so that the amount of reflected light from the inner wall surface 93 toward the peripheral portion of the disk-shaped semiconductor wafer W becomes uniform. When light emitted from the halogen lamps HL and reflected by the inner wall surface 93 is uniformly radiated to the peripheral portion of the semiconductor wafer W, illuminance of the peripheral portion of the semiconductor wafer W where temperature tends to decrease during assist heating from the halogen lamps HL uniformly increases. As a result, in-plane temperature distribution of the semiconductor wafer W during assist heating can be uniform. This enables also in-plane temperature distribution of the front surface of the semiconductor wafer W during the flash heating to be uniform.

In the present preferred embodiment, the inner wall surface 93 of the stainless steel block 91 is nickel-plated to have the same surface finish as the inner wall surface of the chamber 6. Thus, the inner wall surface 93 of the stainless steel block 91 also has a high reflectance, so that the amount of reflected light directed toward the peripheral portion of the semiconductor wafer W from the inner wall surface 93 is sufficiently large to enable the peripheral portion of the semiconductor wafer W where temperature tends to decrease during assist heating to have a higher illuminance. As a result, in-plane temperature distribution of the semiconductor wafer W during assist heating by the halogen lamps HL can be more uniform.

While the preferred embodiments according to the present invention have been described hereinabove, various modifications of the present invention in addition to those described above may be made without departing from the scope and spirit of the invention. For example, while the opening 92 of the stainless steel block 91 has a cylindrical shape in the preferred embodiment described above, the present invention is not limited thereto, and the opening 92 may have an elliptical cylindrical shape, as indicated by the alternate elliptical opening 92a drawn in FIG. 8 in a dashed line. However, if the opening 92 of the stainless steel block 91 has an elliptical cylindrical shape with a high oblateness, it is difficult to uniformly reflect light from the inner wall surface 93 of the opening 92 to the peripheral portion of the disk-shaped semiconductor wafer W. Thus, the opening 92 in an elliptical cylindrical shape has a small oblateness (nearly zero). Specifically, while the inner wall surface of the chamber 6 has a diameter of 436 mm, the elliptical cylindrical opening 92 has a major diameter of 456 mm at most and a minor diameter of 416 mm at minimum. That is, a difference between the major diameter of the opening 92 in an elliptical cylindrical shape and the diameter of the inner wall surface of the chamber 6 as well as a difference between the minor diameter of the opening 92 and the diameter of the inner wall surface of the chamber 6 is 20 mm or less. Even when the stainless steel block 91 is provided with the opening 92 in an elliptical cylindrical shape having a small oblateness as described above, the advantageous effects of the preferred embodiment described above can be obtained. It is preferable to determine whether the opening 92 of the stainless steel block 91 has a cylindrical shape or an elliptical cylindrical shape according to in-plane temperature distribution of the semiconductor wafer W generated during assist heating.

While the inner wall surface 93 of the stainless steel block 91 is nickel-plated in the preferred embodiment described above, the present invention is not limited thereto. The inner wall surface 93 of the stainless steel block 91 may be surface-finished with a reflectance more than that of the inner wall surface of the chamber 6. Specifically, aluminum plating, silver plating, or gold plating, instead of nickel plating, may be applied to the inner wall surface 93 of the opening 92 of the stainless steel block 91, for example. Aluminum plating, silver plating, and gold plating each have a higher reflectance than nickel plating within a wavelength range of light emitted from the halogen lamps HL. That is, when aluminum plating, silver plating, or gold plating is applied to the inner wall surface 93, the inner wall surface 93 of the stainless steel block 91 has a reflectance higher than that of the inner wall surface of the chamber 6. In place of plating, nickel, aluminum, silver, or gold may be vapor-deposited on the inner wall surface 93 of the stainless steel block 91 to increase reflectance. That is, a metal film of nickel, aluminum, silver, or gold may be formed on the inner wall surface 93 of the stainless steel block 91 so as to increase reflectance of the inner wall surface 93. As reflectance of the inner wall surface 93 of the stainless steel block 91 increases, the amount of reflected light directed toward the peripheral portion of a semiconductor wafer W from the inner wall surface 93 increases. This enables illuminance in the peripheral portion of the semiconductor wafer W, where temperature tends to decrease during assist heating, to be further increased.

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. In addition, the number of halogen lamps HL provided in the halogen heating part 4 is not limited to 40. Any number of halogen lamps HL can be used as long as a plurality of halogen lamps HL is arranged in the upper and lower tiers.

In the aforementioned preferred embodiments, the filament-type halogen lamps HL are used as continuous lighting lamps that emit light continuously for not less than one second to perform assist heating the semiconductor wafer W. The present invention, however, is not limited to this. In place of the halogen lamps HL, discharge type arc lamps (e.g., xenon arc lamps) may be used as continuous lighting lamps to perform assist heating the semiconductor wafer W.

Moreover, a substrate to be treated by the heat treatment apparatus according to the present invention is not limited to a semiconductor wafer, but may be a glass substrate for use in a flat panel display for a liquid crystal display apparatus and the like, and a substrate for a solar cell. Also, the technique according to the present invention may be applied to the heat treatment of high dielectric constant gate insulator films (high-k films), to the joining of metal and silicon, and to the crystallization of polysilicon.

Also, the heat treatment technique according to the present invention is not limited to the flash lamp annealer, but may be applied to apparatuses including heat sources other than flash lamps such as single-wafer type lamp annealers employing halogen lamps or CVD apparatuses. Particularly, the technique according to the present invention can be suitably applied to a backside annealer in which a halogen lamp is disposed under a chamber and heat treatment is performed by irradiating a back surface of a semiconductor wafer with light.

While the invention has been shown and described in detail, the foregoing description is in all aspects illustrative and not restrictive. It is therefore understood that numerous modifications and variations can be devised without departing from the scope of the invention.

What is claimed is:

1. A heat treatment apparatus that irradiates a disk-shaped substrate with light to heat the substrate, the heat treatment apparatus comprising:
   a chamber for receiving said substrate therein, said chamber having an inner wall surface in a cylindrical shape;
   a holder for holding said substrate in said chamber;
   a light irradiator having a plurality of rod-like lamps arranged in a rectangular light source region including a region facing a main surface of said substrate held by said holder to irradiate said substrate with light through a quartz window provided in said chamber; and
   a cylindrical body including an opening in a bottomless cylindrical shape, being provided between said chamber and said light irradiator by being connected to a lower end of the chamber, wherein
   a difference between a diameter of said opening of said cylindrical body and a diameter of said inner wall surface of said chamber is 20 mm or less,
   said inner wall surface of said opening of said cylindrical body is plated or vapor deposited with aluminum, silver, or gold,
   while a central portion of said rectangular light source region is within a range of a visual field through said opening of said cylindrical body, four corners of said rectangular light source region are out of the range of the visual field through said opening of said cylindrical body, and
   there is no filament in said plurality of rod-like lamps at the four corners of said rectangular light source region.

2. The heat treatment apparatus according to claim 1, wherein an inner wall surface of said opening of said cylindrical body has a reflectance equal to or higher than a reflectance of an inner wall surface of said chamber.

3. A heat treatment apparatus that irradiates a disk-shaped substrate with light to heat the substrate, the heat treatment apparatus comprising:
   a chamber for receiving said substrate therein, having an inner wall surface in a cylindrical shape;
   a holder for holding said substrate in said chamber;
   a light irradiator having a plurality of rod-like lamps arranged in a rectangular light source region including a region facing a main surface of said substrate held by said holder to irradiate said substrate with light through a quartz window provided in said chamber; and
   a cylindrical body having an opening in an elliptical cylindrical shape, being provided between said chamber and said light irradiator,
   wherein a difference between a major diameter of said opening of said cylindrical body and a diameter of said inner wall surface of said chamber, as well as a difference between a minor diameter of said opening of said cylindrical body and the diameter of said inner wall surface of said chamber is 20 mm or less.

* * * * *